United States Patent
Kim et al.

(10) Patent No.: US 10,396,126 B1
(45) Date of Patent: Aug. 27, 2019

(54) RESISTIVE MEMORY DEVICE WITH ELECTRICAL GATE CONTROL

(71) Applicant: INTERNATIONAL BUSINESS MACHINES CORPORATION, Armonk, NY (US)

(72) Inventors: Seyoung Kim, White Plains, NY (US); Takashi Ando, Tuckahoe, NY (US); Choonghyun Lee, Rensselaer, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/043,634

(22) Filed: Jul. 24, 2018

(51) Int. Cl.
- *G11C 13/00* (2006.01)
- *H01L 27/24* (2006.01)
- *H01L 45/00* (2006.01)

(52) U.S. Cl.
CPC ...... *H01L 27/2472* (2013.01); *G11C 13/0007* (2013.01); *H01L 27/2436* (2013.01); *H01L 45/1206* (2013.01); *H01L 45/1253* (2013.01); *H01L 45/146* (2013.01); *H01L 45/1616* (2013.01); *H01L 45/1683* (2013.01)

(58) Field of Classification Search
CPC ... H01L 45/08; H01L 45/1206; H01L 45/146; H01L 45/1683
See application file for complete search history.

(56) References Cited

U.S. PATENT DOCUMENTS

| | | | | |
|---|---|---|---|---|
| 8,218,359 B2 * | 7/2012 | Suh | ...... | G11C 13/0004 257/4 |
| 8,737,111 B2 | 5/2014 | Kreupl et al. | | |
| 8,737,114 B2 * | 5/2014 | Sandhu | ...... | H01L 45/08 257/2 |
| 9,520,557 B2 | 12/2016 | Lu et al. | | |
| 9,773,552 B2 | 9/2017 | Shih et al. | | |
| 9,780,145 B2 | 10/2017 | Chang et al. | | |
| 2015/0016178 A1 * | 1/2015 | Nardi | ...... | H01L 45/08 365/148 |

(Continued)

OTHER PUBLICATIONS

Degrave, "Dynamic 'Hour Glass' Model for SET and RESET in HfO2 RRAM", Symposium on VLSI Technology Digest of Technical Papers, Jun. 2012, pp. 75-76.

(Continued)

*Primary Examiner* — Allison Bernstein
(74) *Attorney, Agent, or Firm* — Tutunjian & Bitetto, P.C.; Vazken Alexanian

(57) ABSTRACT

Semiconductor devices and methods for forming the semiconductor devices include a gate structure disposed between a top electrode and a bottom electrode, the gate structure including a resistive switching medium contacting a first side of the top electrode and a first side of the bottom electrode. A bottom dielectric layer is disposed on the first side of the bottom electrode around the gate structure. A top dielectric layer is disposed on the first side of the top electrode around the gate structure. A gate electrode is disposed between the first dielectric layer and the second dielectric layer and contacting the gate structure in a middle portion thereof to modulate an electric field perpendicular to current flow between the top electrode and the bottom electrode.

20 Claims, 10 Drawing Sheets

(56) References Cited

U.S. PATENT DOCUMENTS

| | | |
|---|---|---|
| 2015/0162383 A1 | 6/2015 | Hwang |
| 2017/0091618 A1 | 3/2017 | Gokmen et al. |
| 2017/0091620 A1 | 3/2017 | Gokmen et al. |
| 2017/0109626 A1 | 4/2017 | Gokmen et al. |
| 2017/0316824 A1 | 11/2017 | Bedau |
| 2018/0053089 A1 | 2/2018 | Gokmen et al. |

OTHER PUBLICATIONS

Zafar, "Measurement of Oxygen Diffusion in Nanometer HfO2 Gate Dielectric Films", Applied Physics Letters, vol. 98, Apr. 2011, pp. 1-3.

Gokmen, "Acceleration of Deep Neural Network Training Resistive Cross-Point Devices: Design Considerations" Frontiers in Neuroscience, vol. 10, Article 333, Jul. 2016, pp. 1-13.

Ando, "Understanding and Mitigating High-k Induced Device Width and Length Dependencies for FinFET Replacement Metal Gate Technology", IEEE International Electron Device Meeting, Dec. 2015, pp. 1-3.

\* cited by examiner

RESISTIVE MEMORY DEVICE WITH ELECTRICAL GATE CONTROL

BACKGROUND

Technical Field

The present invention generally relates to a resistive memory device, and more particularly to a resistive memory device with electrical gate control.

Description of the Related Art

Deep neural network (DNN) based models are utilized in various applications including, for example, object/speech recognition, language translation, pattern extraction, and image processing by leveraging large labeled datasets. The quality of the DNN models depends on the processing of a large amount of training data and a complexity of the neural network. In this regard, training a complex DNN model is a time consuming and computationally intensive task which can require many days or weeks to perform using parallel and distributed computing frameworks with many computing nodes (e.g., datacenter-scale computational resources) to complete the training of the DNN model.

Hardware acceleration techniques for processing DNN workloads may increase the speed and efficiency of training and applying DNN models by simulating individual neurons of the DNN models using hardware devices. As a result, the hardware devices would be most efficient at this simulation where the devices can be tuned in an analog fashion using, e.g., applied electric fields. However, tunable materials, such as, e.g., materials of tunable resistive devices, do not respond to applied electric fields in a linear or symmetric way. Thus, such devices are less analog, and therefore inefficient for simulating neurons of DNN models.

SUMMARY

In accordance with an embodiment of the present invention, a semiconductor device is described. The semiconductor device includes a gate structure disposed between a top electrode and a bottom electrode, the gate structure including a resistive switching medium contacting a first side of the top electrode and a first side of the bottom electrode. A bottom dielectric layer is disposed on the first side of the bottom electrode around the gate structure. A top dielectric layer is disposed on the first side of the top electrode around the gate structure. A gate electrode is disposed between the first dielectric layer and the second dielectric layer and contacting the gate structure in a middle portion thereof to modulate an electric field perpendicular to current flow between the top electrode and the bottom electrode.

In accordance with another embodiment of the present invention, a crossbar array of semiconductor devices is described. The crossbar array includes a plurality of top electrodes, each top electrode having a bar shape extending in a first direction parallel to each other top electrode and a plurality of bottom electrodes, each bottom electrode having a bar shape extending in a second direction perpendicular to the first direction and parallel to each other bottom electrode, wherein each of the top electrodes intersects with each of the bottom electrodes at a plurality of intersections to form an array. A gate structure is disposed at each intersection between a corresponding top electrode and a corresponding bottom electrode, the gate structure including a resistive switching medium contacting a first side of the top electrode and a first side of the bottom electrode. A bottom dielectric layer is disposed on the first side of the bottom electrode around the gate structure. A top dielectric layer is disposed on the first side of the top electrode around the gate structure. A gate electrode is disposed between the first dielectric layer and the second dielectric layer and contacting the gate structure in a middle portion thereof to modulate an electric field perpendicular to current flow between the top electrode and the bottom electrode.

In accordance with another embodiment of the present invention, a method for forming a semiconductor device is described. The method includes forming a bottom dielectric layer on a first side of a bottom electrode. A gate electrode is formed on the bottom dielectric layer. A top dielectric layer is formed on the gate electrode. A recess is formed through the top dielectric layer, the gate electrode and the bottom dielectric layer down to the bottom electrode. The recess is filled with a resistive switching medium to from a gate structure contacting the first side of the bottom electrode and contacting the gate electrode at a middle portion of the gate structure such that the gate structure modulates an electric field. A top electrode is formed over the gate structure to contact the resistive switching medium at a first side of the top electrode.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
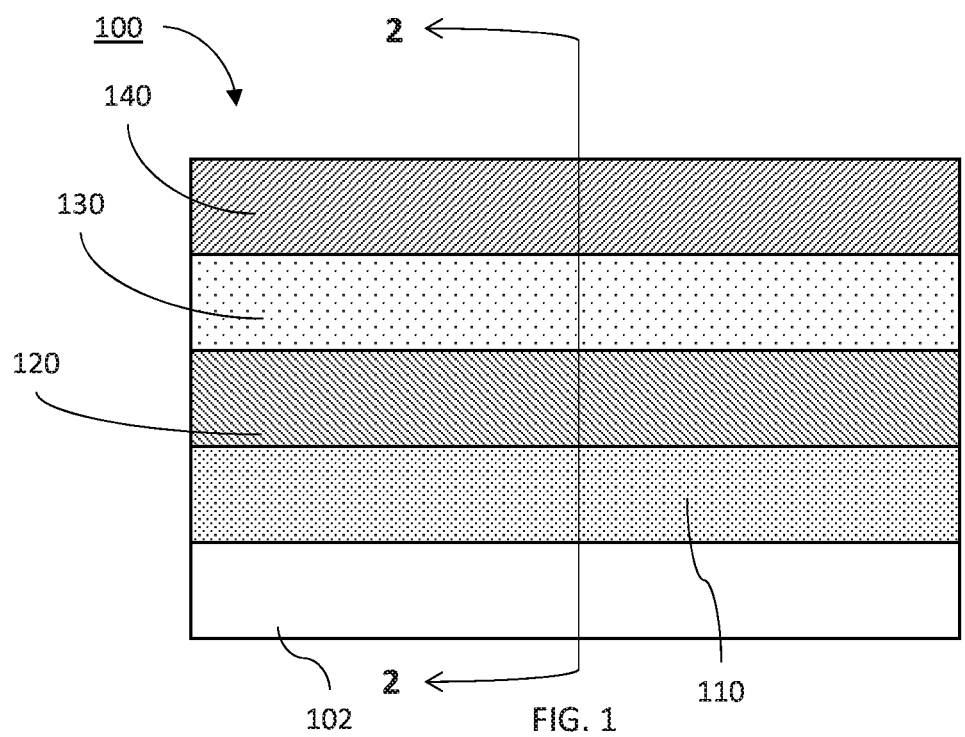
FIG. 1 is a cross-sectional view of a three-terminal semiconductor device, in accordance with an embodiment of the present invention.

According to aspects of the present invention, an embodiment can include a resistive processing unit (RPU) that includes a 3-terminal resistive memory device as the RPU.

A tunable resistive cell, such as, e.g., a RPU, that can store and update weight values locally, can minimize data movement during training and fully exploit the locality and the parallelism of the deep neural network (DNN) training process. Thus, the RPU can be configured to implement forward, backward and weight updating cycles in parallel, thus simulating a neuron of the DNN.

According to an embodiment, the RPU includes at least a switching medium is disposed between a top electrode and a bottom electrode. Around the switching medium between the top and bottom electrodes are two layers of dielectric sandwiching a gate electrode. The gate electrode is in contact with the gate dielectric and the gate dielectric is in contact with the switching medium.

By adding the gate electrode as a third terminal of the memory device, an additional electric field can be applied to the switching medium in a direction opposite to filament growth or contraction. By applying this additional electric field, filament growth and contraction can be better controlled to exhibit more linear and symmetric behavior. Thus, the gate electrode facilitates improvements to device parameters such as, e.g., variations in switching characteristics, including minimum incremental conductance change due to a single coincidence event, asymmetry in up and down conductance changes, tunable range of the conductance values, and various types of noise in the system, all of which can affect the accuracy of the RPU. Accordingly, the RPU can facilitate more efficient acceleration of stochastic training of a DNN. Thus, resistive switching of the switching medium can be made more analog and symmetric compared to complementary metal oxide semiconductor (CMOS) technologies, by using emerging non-volatile memory (NVM) technologies, or even compared to other resistive processing units.

The RPU can be implemented in a non-volatile memory device, such as, e.g., a resistive random-access memory (RRAM). RRAM is considered a promising candidate for next-generation non-volatile memory, due to various advantages such as simplistic device structure, high scalability, high operating speed, and low power consumption. RRAM devices leverage the reversible resistive switching (RS) effect of certain materials, such as the switching medium of the RPU, to realize information storage. For example, a RRAM device may exhibit bi-polar switching properties to switch between a high conductivity state (or low resistance state (LRS)) when a first voltage is applied to the RRAM device, and a low conductivity state (or high resistance state (HRS)) when a second voltage is applied to the RRAM device. In this regard, the two states, LRS and HRS, of the RRAM device are reversible based on the voltage applied thereto. Using the RPU for RRAM facilitates not only switching between the LRS and HRS, but also analog tuning in a range between the LRS and HRS.

Exemplary applications/uses to which the present invention can be applied include, but are not limited to: resistive devices such as resistive random access memory (RRAM), resistive processing units (RPUs) or other resistive memory devices, and processing devices and memory devices employing such resistive devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element described below could be termed a second element without departing from the scope of the present concept.

Referring now to the drawings in which like numerals represent the same or similar elements and initially to FIG. 1, a three-terminal semiconductor device is depicted in accordance with an embodiment of the present invention.

According to an embodiment of the present invention, a semiconductor device 110 such as, e.g., a resistive memory device or resistive processing device, includes a substrate 102. The substrate 102 can include, e.g., monocrystalline silicon (Si), however other suitable materials can be use (for example, silicon germanium (SiGe), gallium arsenide (GaAs), silicon carbide (SiC), polycrystalline silicon, and other group IV, III-V, II-VI and semiconducting materials). Additionally, the substrate can be a silicon-on-insulator substrate or a bulk substrate including an insulating layer or buried oxide (BOX) layer formed thereon.

A bottom electrode 110 can be formed on a surface of the substrate 100. The bottom electrode 110 forms a terminal of the semiconductor device 100, and thus, includes, e.g., a suitable conductive material. For example, the bottom electrode 110 can include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after formation.

The bottom electrode 110 can be formed on the substrate 100 using, e.g., a deposition process, including, e.g., sputtering, chemical vapor deposition (CVD), including, e.g., Atmospheric Pressure CVD (APCVD), Low Pressure CVD (LPCVD) and Plasma Enhanced CVD (EPCVD), Metal-Organic CVD (MOCVD) and combinations thereof. Alternatively, the bottom electrode 110 can be grown with an epitaxial process.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

A bottom dielectric layer 120 can be formed over the bottom electrode 110 and the substrate 102 of the semiconductor device 100. The bottom dielectric layer 120 electrically isolates the bottom electrode 110 such that subsequent materials can be formed over the bottom dielectric layer 120 without interference from the bottom electrode 110 in operation. Accordingly, the dielectric layer 120 can include, e.g., any suitable high-K dielectric material, such as, e.g., an oxide or nitride, including, e.g., silicon nitride (SiN).

The bottom dielectric layer 120 can be formed using, e.g., a suitable deposition process, such as, e.g., CVD or sputtering. The bottom dielectric layer 120 can be deposited such that the dielectric material covers and surrounds the bottom electrode 110 to facilitate isolation of the bottom electrode 110. Accordingly, the bottom dielectric 120 can encompass the bottom electrode 110 on the substrate 102.

A gate electrode 130 can be formed on the bottom dielectric layer 120. Thus, the dielectric layer 120 is between the gate electrode 130 and the bottom electrode 110 and provides electric isolation. Accordingly, the gate electrode 130 and the bottom electrode 110 can carry separate electrical signals with interferences.

The gate electrode 130 provides, e.g., a gate bias, or other electrical signal to the semiconductor device 100. Accordingly, the gate electrode 130 can be formed of a suitable conductive material that is the same or different from the conductive material of the bottom electrode 110. Accordingly the gate electrode 130 can include a conductive material, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after formation.

The gate electrode 130 can be formed on the bottom dielectric layer 120 using, e.g., a deposition process, including, e.g., sputtering, chemical vapor deposition (CVD), including, e.g., Atmospheric Pressure CVD (APCVD), Low Pressure CVD (LPCVD) and Plasma Enhanced CVD (EP-CVD), Metal-Organic CVD (MOCVD) and combinations thereof. Alternatively, the gate electrode 130 can be grown with an epitaxial process.

A top dielectric layer 140 can be formed over the gate electrode 130 of the semiconductor device 100. The top dielectric layer 140 electrically isolates the gate electrode 130 such that subsequent materials can be formed over the top dielectric layer 140 without interference from the gate electrode 130 in operation. Accordingly, the top dielectric layer 140 can include, e.g., any suitable high-K dielectric material that is the same or different from the bottom dielectric layer 120. As such, the top dielectric layer 140 can include, e.g., an oxide or nitride, including, e.g., silicon nitride (SiN).

The top dielectric layer 140 can be formed using, e.g., a suitable deposition process, such as, e.g., CVD or sputtering. The top dielectric layer 140 can be deposited as a layer over a surface of the gate electrode 130 such that the dielectric material covers the gate electrode 130 to facilitate isolation of the gate electrode 130.

Figure 2:
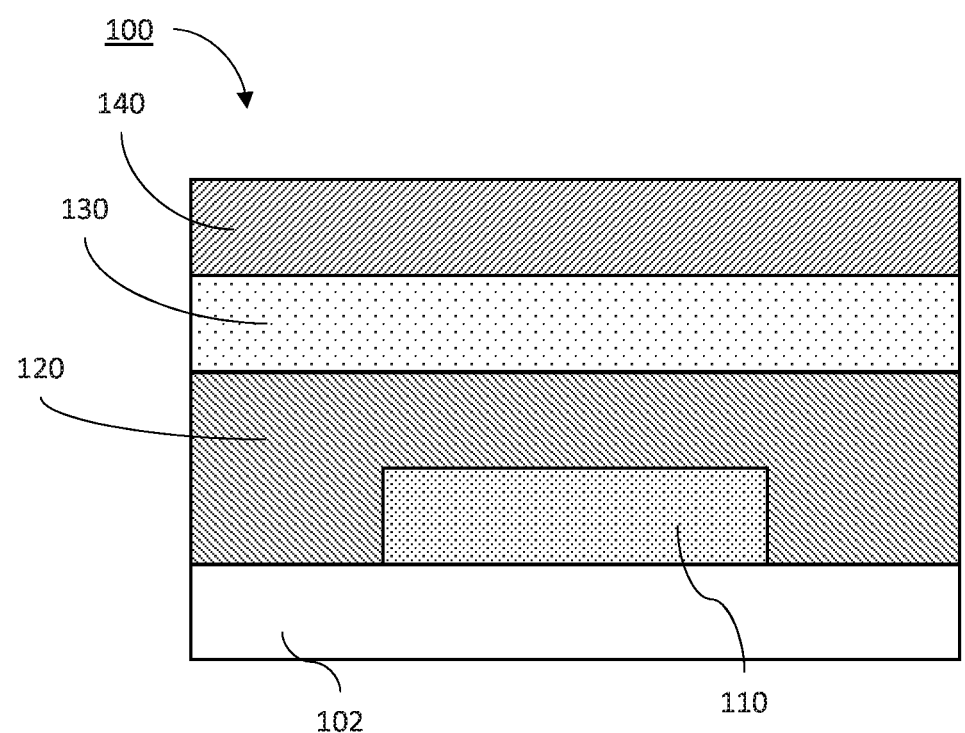
FIG. 2 is a cross-sectional view of cross-section 2-2 of the three-terminal semiconductor device of FIG. 1, in accordance with an embodiment of the present invention.

Referring now to FIG. 2, a cross-sectional view of cross-section 2-2 of the three-terminal semiconductor device of FIG. 1 is depicted according to an embodiment of the present invention.

According to an embodiment of the present invention, the bottom electrode 110 can be formed in a bar along the substrate 102. Accordingly, a width of the bottom electrode 110 along cross-section 2-2 is smaller than a length as depicted in FIG. 1. To form the bar of the bottom electrode 110 across the semiconductor device 100, the bottom electrode 110 can be patterned after deposition or epitaxial growth. Thus, the bottom electrode 110 can be, e.g., etched according to a patterned mask formed thereon. The etching can include a selective etch process, such as, e.g., an anisotropic etch process including reactive ion etching (RIE), such that the bottom electrode 110 is etched selective to the mask. Accordingly, material of the bottom electrode 110 is removed from exposed areas of the mask, thus forming the bar shaped bottom electrode 110 extending across the substrate 102 of the semiconductor device 100.

The bottom dielectric layer 120 can then be, e.g., deposited to encompass the bottom electrode 110. Accordingly, the bar shaped bottom electrode 110 can be narrower across the cross-section 2-2 than the bottom dielectric layer 120 such that the bottom electrode 110 is encompassed by the bottom dielectric layer 120.

The gate electrode 130 is deposited as a layer across a surface of the bottom dielectric layer 120. Accordingly, the gate electrode 130 covers, e.g., an entire top surface of the bottom dielectric layer 120 across the semiconductor device 100.

As described above, the top dielectric layer 140 is deposited as a layer across the surface of the gate electrode 130. Accordingly, the top dielectric layer 140 covers, e.g., an entire top surface of the gate electrode 130 across the semiconductor device 100 to facilitate isolation of the gate electrode 130 between the top dielectric layer 140 and the bottom dielectric layer 120.

Figure 3:
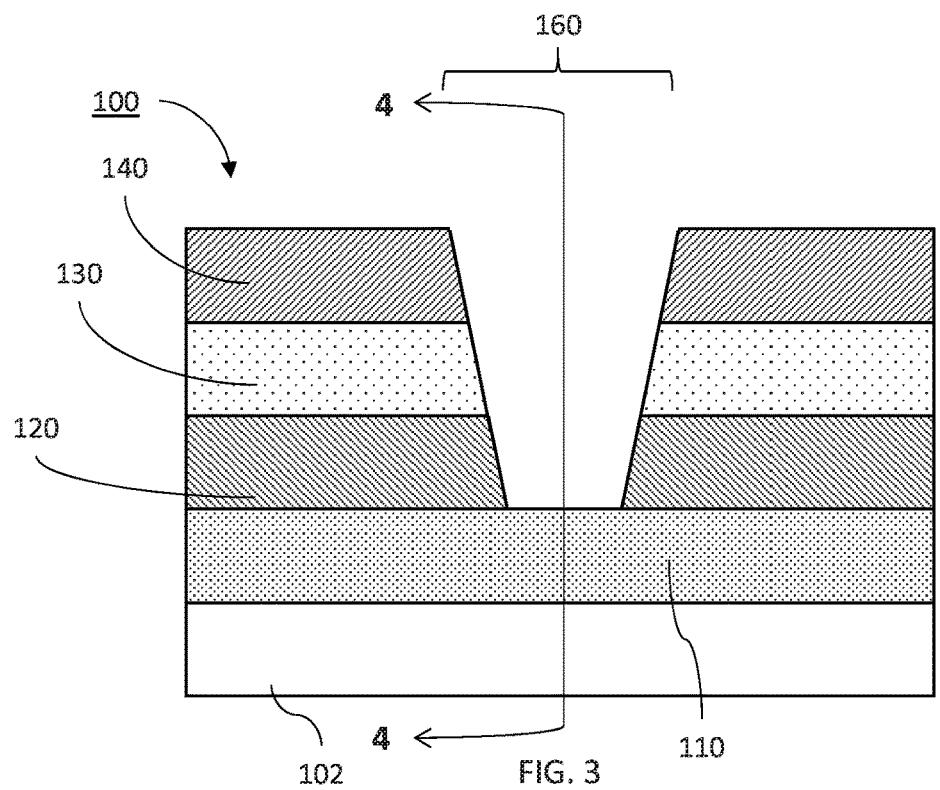
FIG. 3 is a cross-sectional view of a recess formed through a first and second dielectric layer and gate electrode of a semiconductor device, in accordance with an embodiment of the present invention.

Referring now to FIG. 3, a recess formed through a first and second dielectric layer and gate electrode of a semiconductor device is depicted according to an embodiment of the present invention.

According to aspects of the present invention, a recess can be formed for a gate structure 160. The hole extends through the top dielectrically layer 140, the gate electrode 130 and the bottom dielectric layer 120 down to the bottom electrode 110. Thus, each layer can be separately recessed to form the recess for the gate structure 160.

Recessing each layer can include, e.g., an etch process, such as a selective etch process. For example, a mask can be formed over the semiconductor device 100 and patterned to open a exposed area in the top surface of the top dielectric layer 140 through the mask. The mask can be patterned using, e.g., photolithography. The top dielectric layer 140 can then be etched selective to the mask, creating a recess in the top dielectric layer 140.

The gate electrode 130 can then be etched through the mask selective to the mask and to the top dielectric layer 140. Similarly, the bottom dielectric layer 120 can be etched through the mask selective to the mask and to the bottom electrode 110. Thus, the bottom electrode 110 is not recessed or damaged, and electric performance of the bottom electrode 110 can be preserved.

The etch process can be any suitable etch process, such as, e.g., anisotropic etching including wet etching or RIE. Upon etching down to the bottom electrode 110, the mask can be removed.

Figure 4:
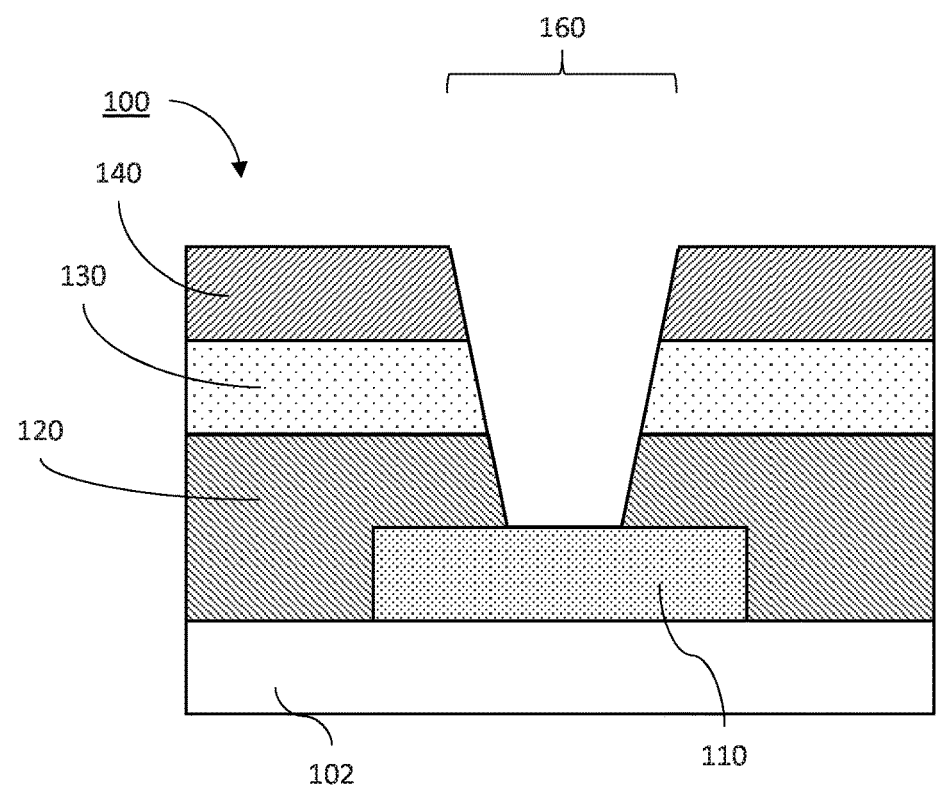
FIG. 4 is a cross-sectional view of cross-section 4-4 of the recess formed through the first and second dielectric layer and the gate electrode of the semiconductor device of FIG. 3, in accordance with an embodiment of the present invention.

Referring now to FIG. 4, the recess formed through the first and second dielectric layer and the gate electrode of the semiconductor device of FIG. 3 is depicted according to an embodiment of the present invention.

The recess in the block mask can be of any desired shape. However, according to aspects of the present invention, a hole in the mask can be patterned to be, e.g., a square or a circle. As a result, the recess for the gate structure 160 has a corresponding footprint. Thus, the recess for the gate structure 160 can include, e.g., a square or a circular footprint such that the cross-section 4-4 of the semiconductor device 100 depicts a recess of equal width to the recess as depicted in FIG. 3.

Figure 5:
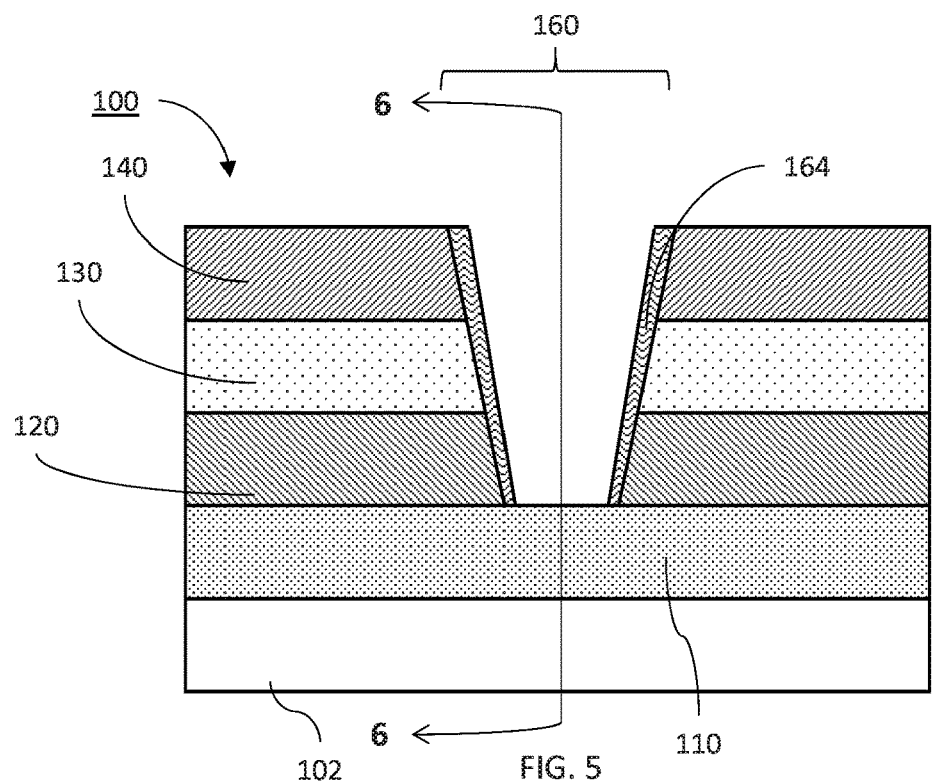
FIG. 5 is a cross-sectional view of a gate dielectric formed in a recess of a semiconductor device, in accordance with an embodiment of the present invention.

Referring now to FIG. 5, a gate dielectric formed in a recess of a semiconductor device is depicted according to an embodiment of the present invention.

A gate dielectric 164 can be formed within the recess of the gate structure 160. The gate dielectric 164 forms an insulating layer between the gate structure 160 and the gate electrode 130. Accordingly, the gate dielectric 164 can include a suitable insulating material, such as, e.g., an oxide or a nitride.

The gate dielectric 164 can be formed, e.g., by conformally depositing a layer of the dielectric material across the semiconductor device 100 using a deposition process, such as, e.g., atomic layer deposition (ALD). Upon forming a conformal coating of the dielectric material over the semiconductor device, including in the recess of the gate structure 160 and on the bottom electrode 110 therein, and over the top dielectric layer 140, the horizontal portions of the dielectric material can be removed. Thus, only horizontal portions of the dielectric material remains to form the gate dielectric layer 164. Accordingly, the horizontal portions can be removed using, e.g., anisotropic etching such as, e.g., RIE, or chemical mechanical planarization (CMP).

Figure 6:
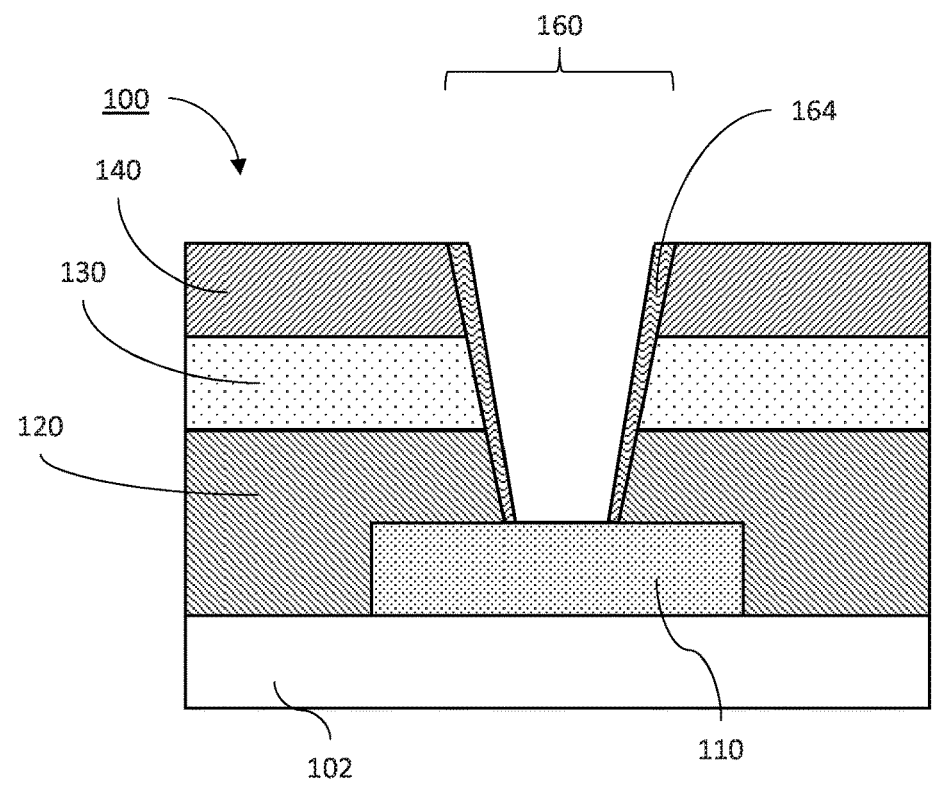
FIG. 6 is a cross-sectional view of cross-section 6-6 of the gate dielectric formed in the recess of the semiconductor device of FIG. 5, in accordance with an embodiment of the present invention.

Referring now to FIG. 6, the gate dielectric formed in the recess of the semiconductor device of FIG. 5 is depicted according to an embodiment of the present invention.

The gate dielectric 164 is formed uniformly around the recess for the gate structure 160. Accordingly, cross-section 6-6 depicts the gate dielectric 164 on sidewalls of the recess for the gate structure 160, similar to FIG. 11 above.

Figure 7:
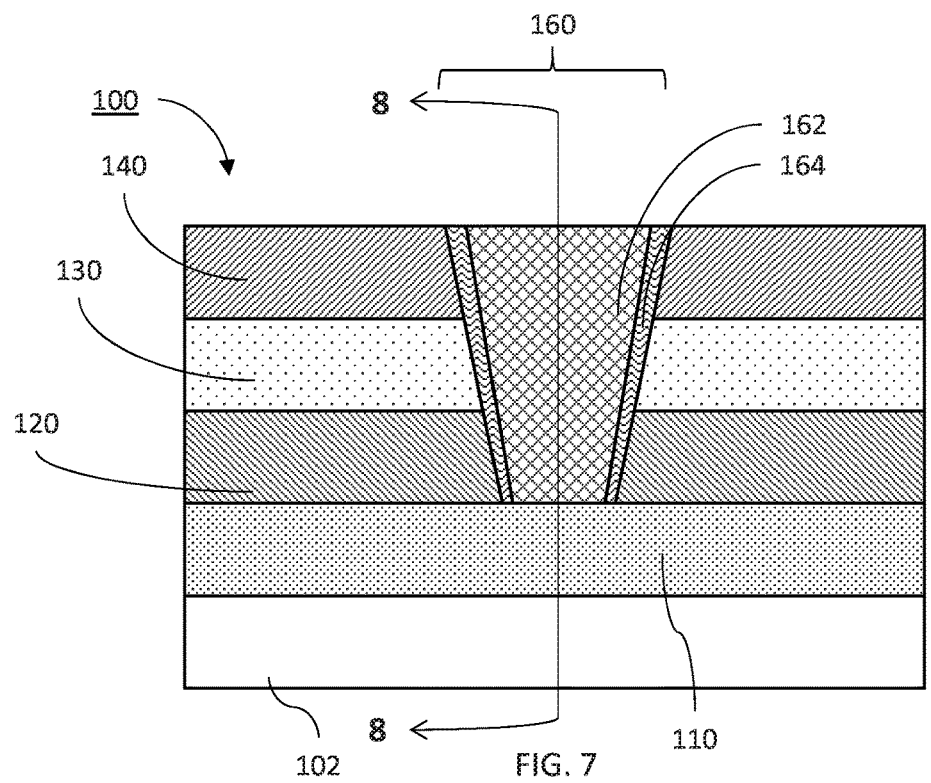
FIG. 7 is a cross-sectional view of a resistive switching medium of a semiconductor device, in accordance with an embodiment of the present invention.

Referring now to FIG. 7, a resistive switching medium of a semiconductor device is depicted according to an embodiment of the present invention.

The gate structure 160 can be formed by filling the recess with a switching medium 162. This switching medium 162 can include, e.g., a suitable material for resistive switching in response to an electrical signal by, e.g., conducting channel or filament formation in response to a voltage. For example, the switching medium 162 can include, e.g., a high-K dielectric, such as, e.g., hafnium dioxide ($HfO_2$), aluminum oxide ($Al_2O_3$), zirconium dioxide ($ZrO_2$), silicon dioxide ($SiO_2$), or other oxides. The switching medium 162 may be deposited by a suitable deposition process for filling the recess of the gate structure 160, such as, e.g., chemical vapor deposition process (CVD), a plasma enhanced CVD (PECVD), etc. The switching medium 162 can be planarized with, e.g., CMP, to form a top surface that is coplanar with a top surface of the top dielectric layer 140.

Figure 8:
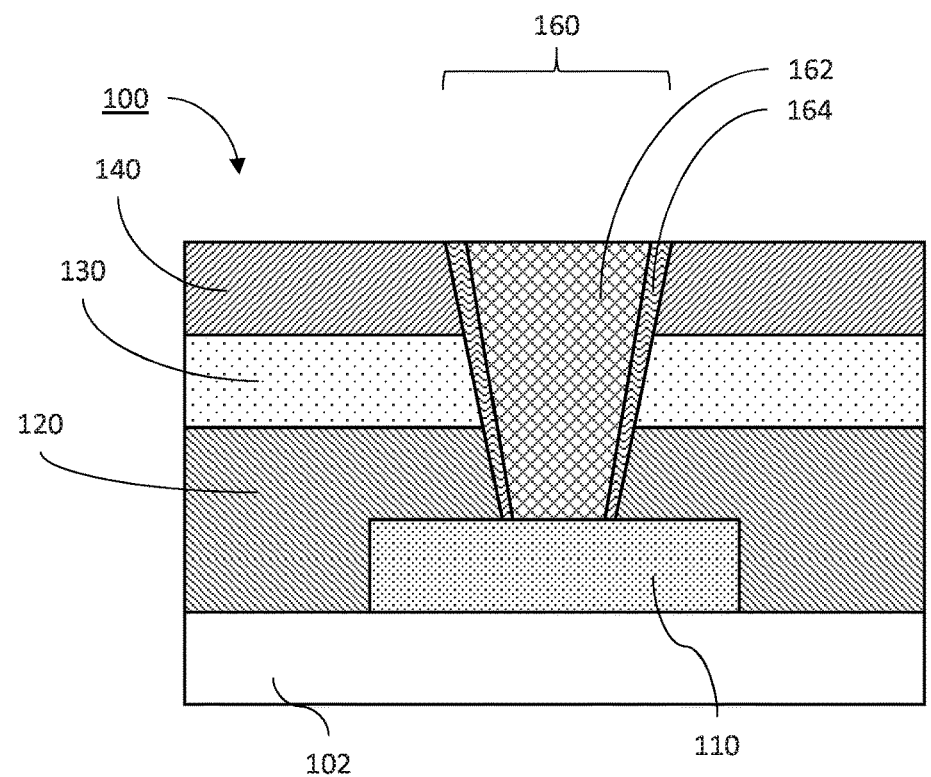
FIG. 8 is a cross-sectional view of cross-section 8-8 of the resistive switching medium of the semiconductor device of FIG. 7, in accordance with an embodiment of the present invention.

Referring now to FIG. 8, the resistive switching medium of the semiconductor device of FIG. 7 is depicted according to an embodiment of the present invention.

The switching medium 162 fills the recess of the gate structure 160 to complete the gate structure 160. As a result, the switching medium 162 takes a same cross-sectional and footprint shape as the recess of the gate structure 160, as depicted from cross-section 8-8.

Figure 9:
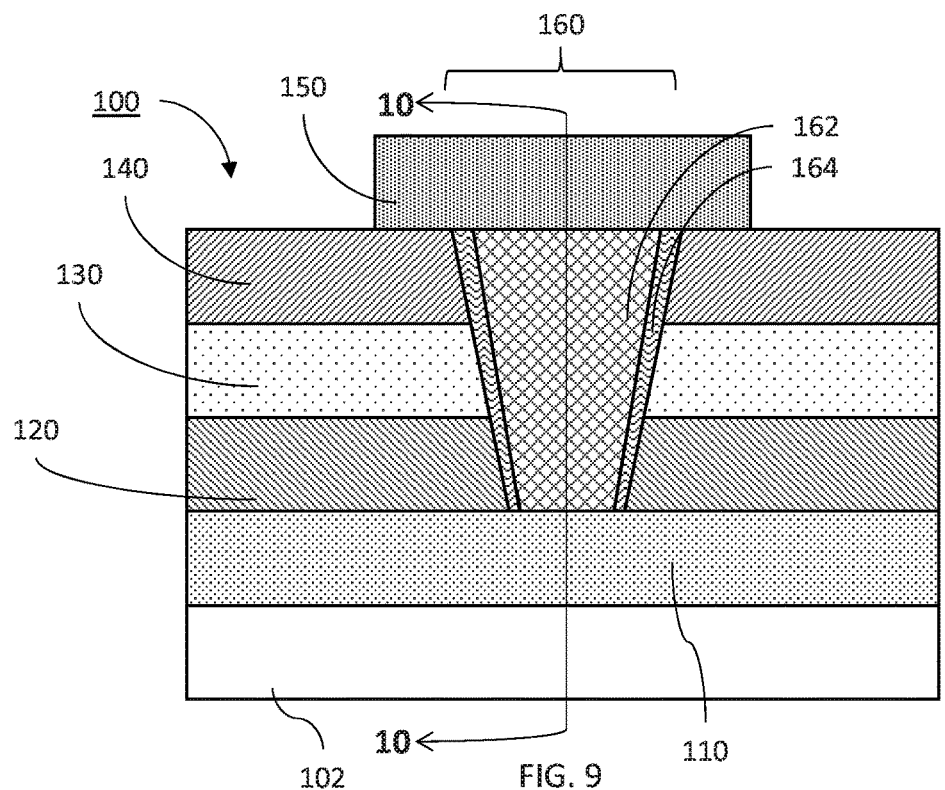
FIG. 9 is a cross-sectional view of a top electrode disposed over a resistive switching medium of a semiconductor device, in accordance with an embodiment of the present invention.

Referring now to FIG. 9, a top electrode disposed over a resistive switching medium of a semiconductor device is depicted according to an embodiment of the present invention.

A gate electrode 130 can be formed on the bottom dielectric layer 120. Thus, the dielectric layer 120 is between the gate electrode 130 and the bottom electrode 110, provide electric isolation. Accordingly, the gate electrode 130 and the bottom electrode 110 can carry separate electrical signals with interferences.

A top electrode 150 provides another terminal for the gate structure 160 to facilitate switching. In operation, current travels through the gate structure 160 between the top electrode 150 and the bottom electrode 110. Accordingly, the top electrode 150 can be formed of a suitable conductive material that is the same or different from the conductive material of the bottom electrode 110. Accordingly the top electrode 150 can include a conductive material, such as, e.g., the conductive materials described above with reference to the bottom electrode 110. The top electrode 150 can be formed on the bottom dielectric layer 120 using, e.g., a deposition process, including, the deposition processes described above.

The top electrode 150 can be formed in a bar shape. Accordingly, the top electrode 150 only extends across the semiconductor device 100 in one direction, and is narrowed in a perpendicular direction across the semiconductor device 100. Accordingly, a mask can be patterned over a deposited layer of conducting material. As described above, the mask can be deposited and patterned via photolithography. Once patterned, the conductive material can be etched selective to mask such that portions of the conductive material that are exposed through the pattern of the mask are recessed down to the top dielectric layer 140. As such, portions of the conductive material that are covered by the mask pattern remain to form a bar of conductive material, resulting in the top electrode 150.

The top electrode 150 can extend along a direction over the semiconductor device 100 that is perpendicular to the direction of the bottom electrode 110. Thus, the bars of the top electrode 150 and the bottom electrode 110 intersect at the gate structure 160 such that the gate structure 160 extends through the semiconductor device 100 from the bottom electrode 110 to the top electrode 150. As a result, the top electrode 110 and bottom electrode 150 contact opposite ends of the switching medium 162 of the gate structure 160 to form two terminals of the semiconductor device 100 where an applied electrical signal travels from one electrode, through the switching medium 162, to the other electrode.

As a result, the top electrode 150 can form a word-line while the bottom electrode 110 can form a bit-line, or vice versa, such that a signal can be efficiently applied and read across the gate structure 160 with low power draw.

Figure 10:
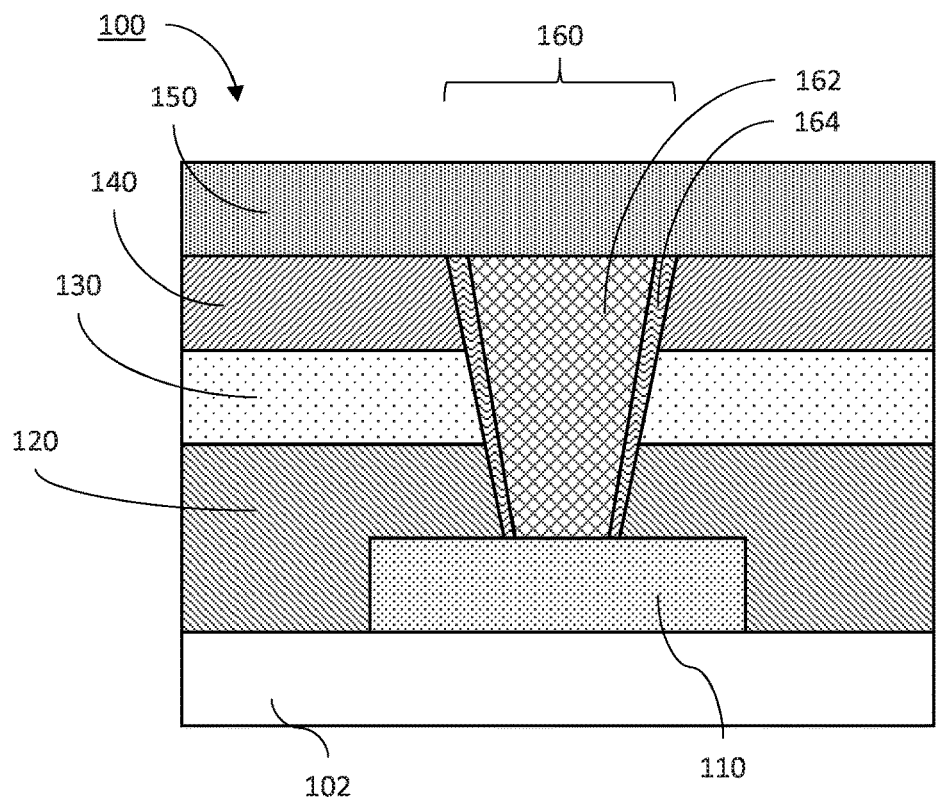
FIG. 10 is a cross-sectional view of cross-section 10-10 of the top electrode disposed over the resistive switching medium of the semiconductor device of FIG. 9, in accordance with an embodiment of the present invention.

Referring now to FIG. 10, the top electrode disposed over the resistive switching medium of the semiconductor device of FIG. 9 is depicted according to an embodiment of the present invention.

From cross-section 10-10, the top electrode 150 extends across the semiconductor device 100 in a direction across the semiconductor device that is perpendicular to the bottom electrode 110. As a result, the bottom electrode 110 extends only partially across the semiconductor device 100 such that the bottom electrode 110 forms a bar extending depth-wise into the cross-section 10-10.

Figure 11:
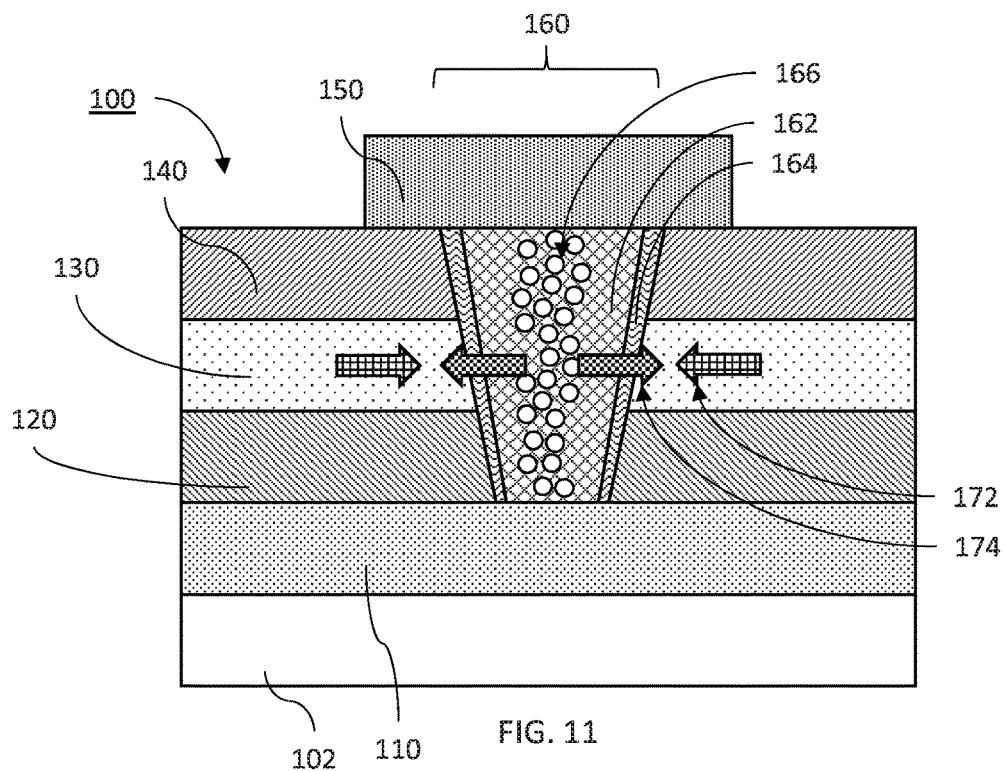
FIG. 11 is a cross-sectional view of a semiconductor device having a horizontally grown filament in a resistive switching medium, in accordance with an embodiment of the present invention.

Referring now to FIG. 11, a semiconductor device having a horizontally grown filament in a resistive switching medium is depicted according to an embodiment of the present invention.

Resistive switching in the semiconductor device 100 can be caused by applying a voltage across the switching medium 162 such that a conducting channel 166 is formed. Because the switching medium 162 can be, e.g., a high-K material, forming a conducting channel 166 can be facilitated by electrode materials that assist in oxygen scavenging. For example, the top electrode 150 can be formed of, e.g., a reactive oxygen scavenging material, such as, e.g., erbium (Er), lanthanum (La), yttrium (Y), ytterbium (Yb), scandium (Sc), cerium (Ce), praseodymium (Pr), neodymium (Nd), samarium (Sm), dysprosium (Dy), holmium (Ho), thulium (Tm), lutetium (Lu) or other rare earth elements although other conductors such as, e.g., hafnium (Hf), nickel (Ni), aluminum (Al), titanium (Ti), calcium (Ca), magnesium (Mg), zirconium (Zr), etc. or alloys thereof. While the top electrode 150 is described as being an oxygen scavenging electrode according to an embodiment of the present invention, other arrangements are also contemplated, such as, e.g., a bottom electrode 110 configured as an oxygen scavenging electrode with an oxygen scavenging conductive material.

Accordingly, upon applying a voltage across the electrodes 110 and 150, mobile oxygen vacancies which are created by oxygen scavenging, as assisted by the top electrode 150. As the oxygen scavenging top electrode 150 consumes oxygen at the interface of the switching medium 162 and the top electrode 150, mobile oxygen vacancies are created in the switching medium 162 that forms a conductive filament through the switching medium 162. Applying a greater voltage difference across the top electrode 150 and the bottom electrode 110 can lead to greater filament growth, both vertically between the top electrode 150 and the bottom electrode 110, and horizontally towards sides of the switching medium 162, that reduces resistance through the conductive path 166. Similarly, an opposite voltage difference can contract or rupture the filament to increase resistance of the conductive path 166. However, applying an electric field to the switching medium 162 using only the top electrode 150 and the bottom electrode 110 can result in non-linear and asymmetric switching behavior in response to a voltage difference. Thus, the gate electrode 130 can be used to reduce or augment the impact of applied voltage using one or both of the top electrode 150 and the bottom electrode 110 by opposing the horizontal portion of filament growth and contraction.

To facilitate increasing the linearity and symmetry of filament growth, an electric field can be applied using the gate electrode 130. Upon applying a voltage differential between the top electrode 150 and the bottom electrode 110, the conducting channel 166 can grow through the switching medium 162. The growth in the horizontal direction towards sides of the gate structure 160 approaching the gate dielectric 164, as denoted by arrows 174, can be controlled with an applied electric field 172 opposite to the horizontal filament growth 174. Thus, excessive horizontal growth 174 can be limited and controlled using the electric field 172 such that non-linear switching behavior is alleviated and analog switching is promoted.

Figure 12:
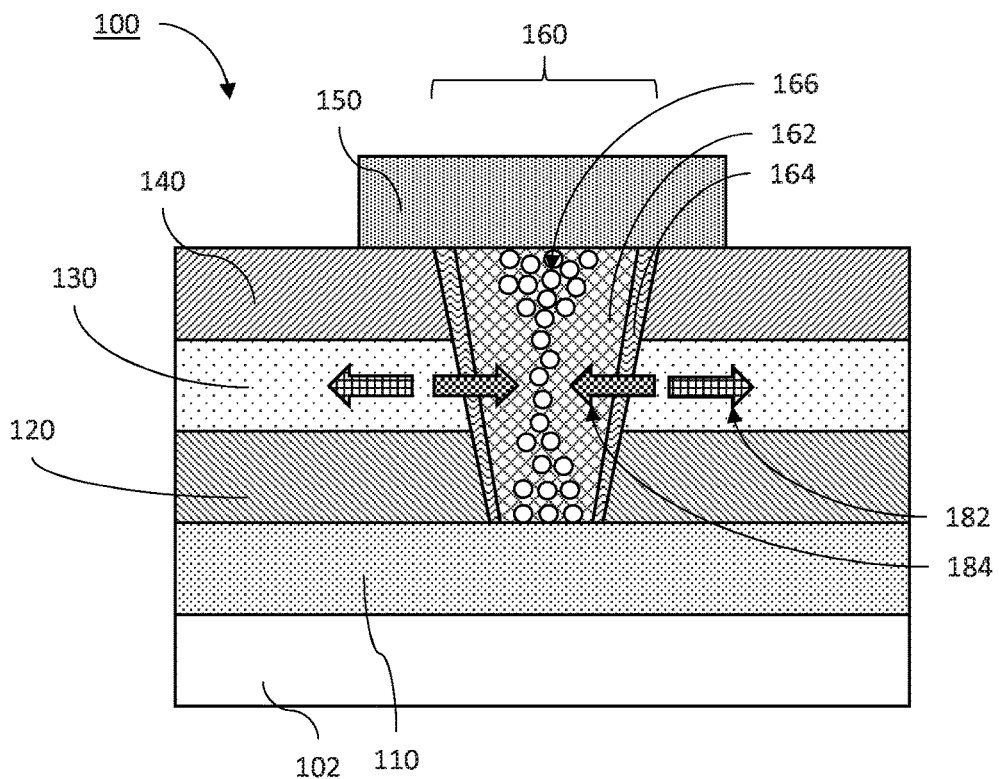
FIG. 12 is a cross-sectional view of a semiconductor device having a horizontally contracted filament in a resistive switching medium, in accordance with an embodiment of the present invention.

Referring now to FIG. 12, a semiconductor device having a horizontally contracted filament in a resistive switching medium is depicted according to an embodiment of the present invention.

Similar to FIG. 11 above, a voltage difference between the top electrode 150 and the bottom electrode 110 can also lead to contraction 184 of the conduction channel 166, thus reducing filament width. Due to non-linear switching behaviors, the voltage difference alone can result in premature rupture of the filament. As a result, an electric field 182 can be applied in a direction opposite to the filament contraction 182 to control the contraction with the gate electrode 130. Thus, the contraction of the filament formed in the conduction channel 166 can be made more analog and symmetric to filament growth.

Figure 13:
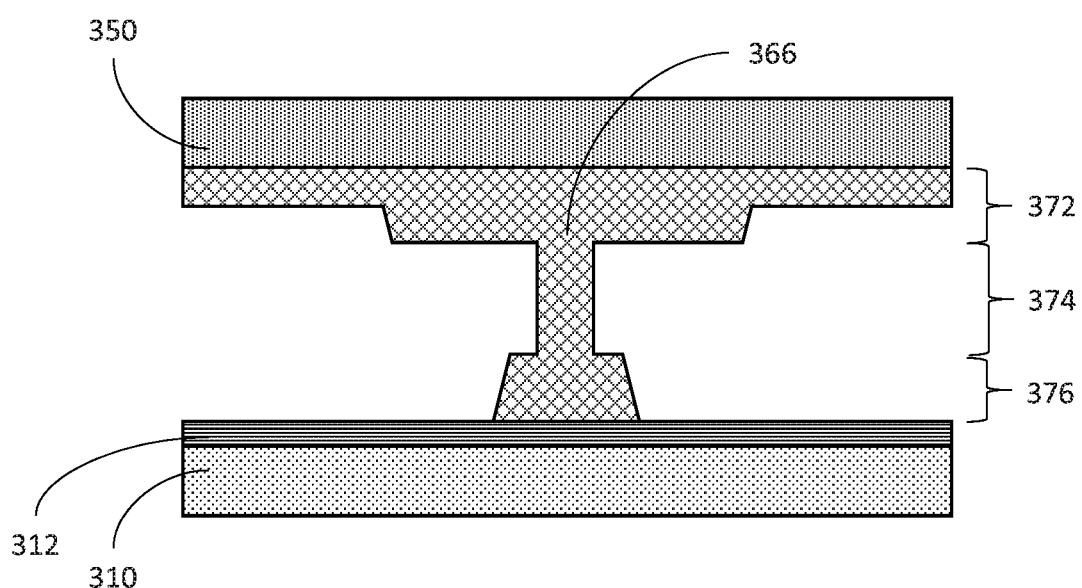
FIG. 13 is a cross-sectional view of a resistive random access memory device according to an Hour Glass Model, in accordance with an embodiment of the present invention.

Referring now to FIG. 13, a cross-section of resistive random access memory device according to an Hour Glass Model is depicted according to an embodiment of the present invention.

As described above, a voltage difference between a top electrode 350 and a bottom electrode 310 can generate oxygen vacancies at an oxygen scavenging electrode, such as, e.g., the top electrode 350 and/or the bottom electrode 310. According to aspects of the present invention, the top electrode 350 can include an oxygen scavenging conductive material such as, e.g., Hf. According to at least one embodiment of the present invention, the bottom electrode 310 can be formed of a suitable conductive material including, e.g., Ti, Cu, Au, or any other metal or alloys thereof. The bottom electrode 310 can include a diffusion barrier 312 to prevent diffusion of the bottom electrode 310 material into a conductive channel 366 of a switching medium. The diffusion barrier 312 can be a suitable material for prevent diffusion, such as, e.g., titanium nitride (TiN).

The conductive channel 366 can be formed of a suitable dielectric material for forming oxygen vacancies to modulate resistance, such as, e.g., $HfO_2$. Therefore, the voltage difference can generate oxygen vacancies at the top electrode 350 to form a top reservoir 372. Similarly, the voltage can also generate a bottom reservoir 376 at the diffusion barrier 312.

Applying the voltage difference can extend a filament out of the each of the top reservoir 372 and bottom reservoir 374 to form a constricted connection 374. To set a filament size, and thus set a resistance, the voltage difference first needs to reach a trigger voltage. The constriction 374 growth is triggered when a transition point is reached at the trigger voltage. oxygen vacancies are introduced, widening the constriction 374 such that the trigger voltage is increased. As a result, an applied voltage is constant but falls below the trigger voltage. An electrical load can be increased by, e.g., increasing the applied voltage until the transition point is reached again, thus triggering the formation for more oxygen vacancies. As a result, transition curve can represent the trigger voltage at each amount of oxygen vacancies. A current of the electrical load, when the voltage is kept constant, oscillates along the transition curve for each amount of oxygen vacancies as more oxygen vacancies are introduced. Thus, the hour glass model predicts an increase of a transition voltage as a function of the voltage ramp rate.

Accordingly, a constriction 374 of an oxygen vacancy filament is set as constriction growth limited by ion mobility and current compliance. Thus, the constriction growth is dependent on time, voltage and oxygen vacancy formation conditions. As a result, an applied voltage from, e.g., a gate electrode 130 can modulate and control the constriction 374 while applying a signal across the switching medium between the top electrode 350 and the bottom electrode 310.

This relation of oxygen vacancies to an applied voltage can be shown in other devices where diffusion barriers, such as, e.g., $HfO_2$ are used. As shown in table 1 below, an oxygen diffusion barrier is the lowest for oxygen vacancy ion ($V_o^{2+}$) mediated diffusion compared to oxygen vacancy ($V_o$), oxygen (O) interstitial, O exchange and hydrogen (H) interstitial diffusion for a given applied electrical field. Thus, diffusion is controllable via an electrical field, with $V_o^{2+}$ having the lowest diffusion barrier among oxygen diffusion species in $HfO_2$.

TABLE 1

|  | O Interstitial | O Exchange | $V_o$ Mediated | $V_o^{2+}$ Mediated | H Interstitial |
|---|---|---|---|---|---|
| x-axis Barrier (eV) | 1.56 | 2.21 | 3.12 | 1.27 | 1.68 |
| y-axis Barrier (eV) | 1.46 | 0.99 | 2.17 | 1.36 | 0.50 |
| z-axis Barrier (eV) | 1.59 | 0.77 | 1.60 | 0.76 | 0.50 |
| Diffusion Length (nm, 4 hrs @400 C.) | <1 | 470 | <1 | 280 | 3722 |
| Effective Work Function Impact | None | None | None | Increase | None |

Figure 14:
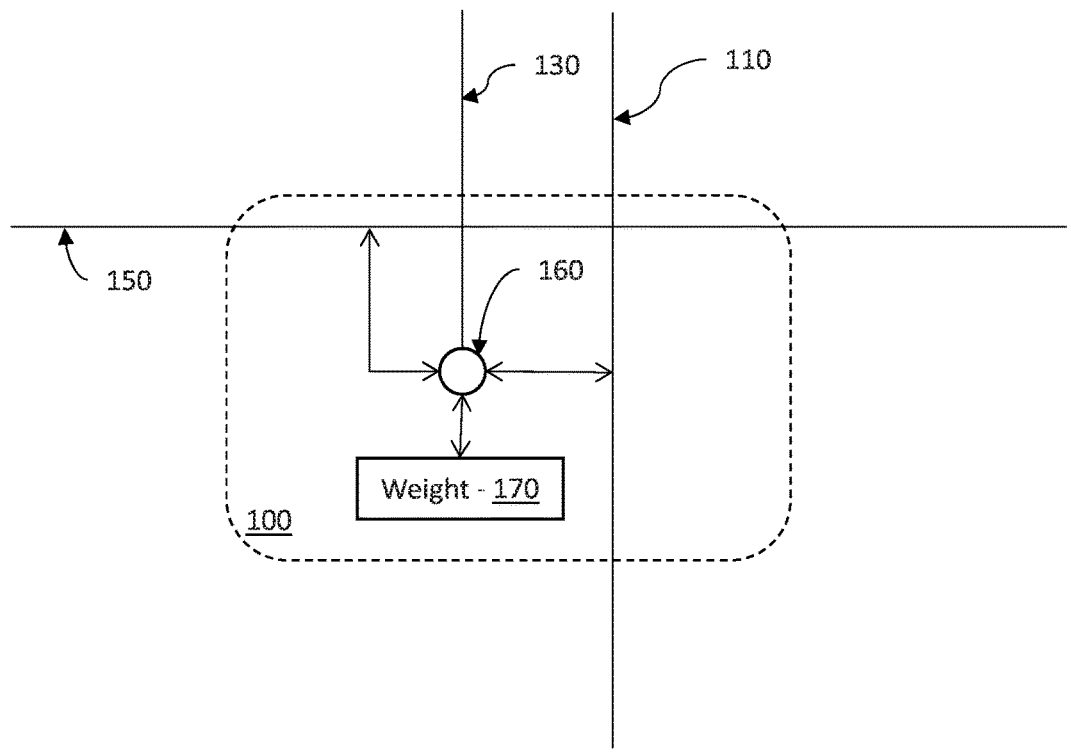
FIG. 14 is a diagram of a three-terminal RPU with electric gate control, in accordance with an embodiment of the present invention.

Referring now to FIG. 14, a three-terminal RPU with electric gate control is depicted according to an embodiment of the present invention.

According to an embodiment of the present invention, a three-terminal RPU 100 is contemplated. The RPU 100 can include a crosspoint RPU that includes a row wire 150 and column wire 110 with a crosspoint device 160 at the intersection of the row wire 150 and the column wire 110. The crosspoint device 160 can include, e.g., a resistive switching medium for recording and processing data with analog resistive switch, such as, e.g., the semiconductor device 100 described above. Accordingly, signals can be supplied to the crosspoint device 160 via row wire 150 and column wire 110.

A weight 170 can be applied with the crosspoint device 160 to one or both of the signals in the row wire 150 and the column wire 110. Thus, the crosspoint device 160 can perform weighting operations, such as, e.g., addition, multiplication, or other operations, of one signal with a weighted second signal. For example, in a forward pass operation, an input signal can be provided to the crosspoint device 160 by the row line 150. A nominal signal can be provided by the column line 110. To generate an output signal through the column line 110, the weight 170 multiplies the signal of the row line 150. The output of the crosspoint device 160 is then added to the nominal signal of the column line 110 to generate the output.

Similarly, the reverse of the forward pass operation can be performed as a backward pass. Thus, a return signal, such as, e.g., an error signal, can be provided through the column line 110. The error signal can be provided to the crosspoint device 160. The error signal can be modified by the weight value 170 at the crosspoint device 160 and returned through the row line 150 by adding the weighted error signal to a nominal signal through the row line 150. Thus, the weight value 170 stored in the crosspoint device 160 can be used to process in both forward pass and backward pass operations.

Additionally, the crosspoint device 160 can be modulated with an updated weight value 170. Thus, an input signal can be provided to the crosspoint device 160 by the row line 150, while an error signal can be provided by the column line 110. The provision of both the error signal and the input signal can increase the voltage differential in the crosspoint device 160 such that a voltage threshold is reached and the resistance in the switching medium of the crosspoint device 160 is modulated according to the error signal. However, in a two terminal arrangement, the modulation may be unpredictable and error prone due to non-linearities in switching of the switching medium. Accordingly, the RPU 100 can further include a third terminal including, e.g., a gate electrode 130. The gate electrode 130 can provide an electrical field bias to the crosspoint device 160 to compensate for the non-linearities in the resistance switching of the switching medium in response to voltage differentials. Thus, the gate electrode 130 facilitates accurate and reliable weight updating by mitigating the non-linearities through, e.g., preventing growth of a constriction in a conductive filament of the switching medium. As described above, control of the growth of the constriction can include, e.g., applying an electrical field with the gate electrode 130 opposite to constriction growth or contraction. Thus, the crosspoint device 160 can operate with greater performance and efficiency.

Figure 15:
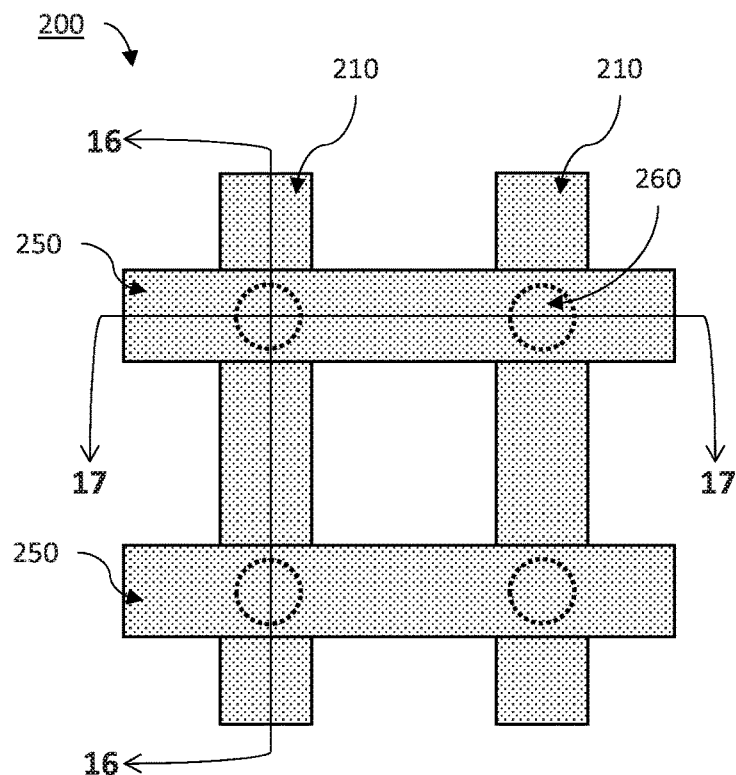
FIG. 15 is a plan view of a crossbar RPU array, in accordance with an embodiment of the present invention.

Referring now to FIG. 15, a crossbar RPU array is depicted according to an embodiment of the present invention.

According to aspects of the present invention, a device array 200 can include an array of RPUs 260. The RPUs 260 can, e.g., be the crosspoint device 160 described above such as, e.g., the gate structure 160 of the semiconductor device 100 described above. Accordingly, the RPUs 260 can each include, e.g., a top electrode 250 in a bar shape and a bottom electrode 210 in a bar shape. The top electrode 250 can extend across the device array 200 contacting multiple RPUs 260. The bottom electrode 210 can extend across the device array 200 in a direction perpendicular to the top electrode 250 such that the bottom electrode 210 contacts multiple RPUs 260. Accordingly, a given bottom electrode 210 intersects with a given top electrode 250 at only one RPU 260. Thus, each RPU 260 forms a crosspoint device in an array.

Figure 16:
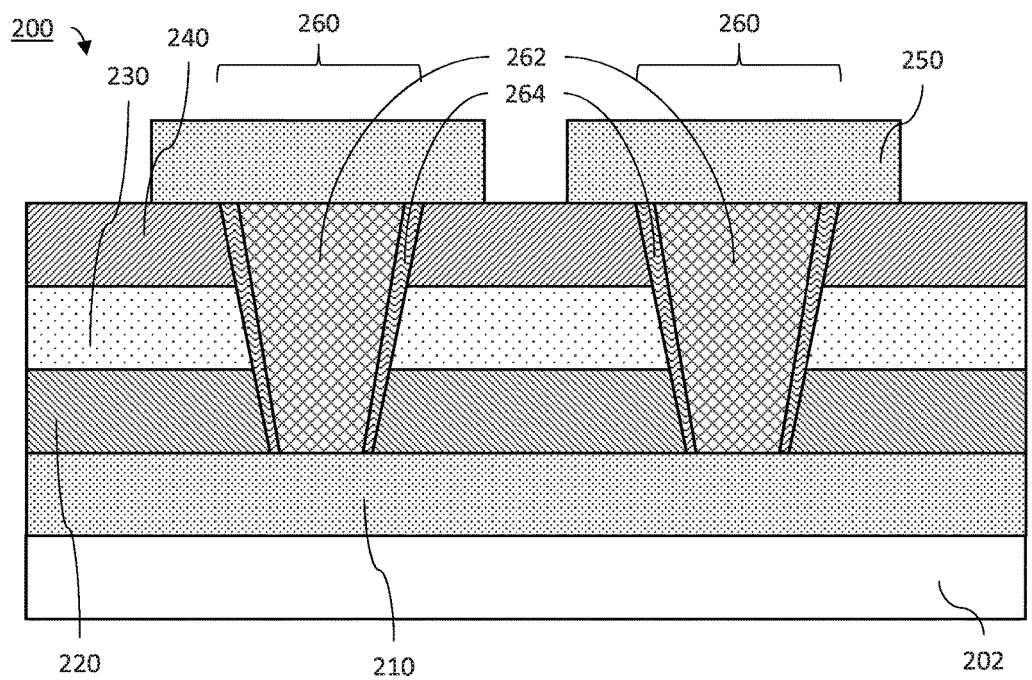
FIG. 16 is a cross-sectional view of cross-section 16-16 of the crossbar RPU array of FIG. 15, in accordance with an embodiment of the present invention.

Referring now to FIG. 16, the crossbar RPU array of FIG. 15 is depicted according to an embodiment of the present invention.

According to aspects of the present invention, the crossbar device array 200 of FIG. 15 can include a substrate 202 and multiple RPUs 260 between the bottom electrode 210 and the top electrode 250.

Similar to the semiconductor device 100 described above, each RPU 260 of the crossbar device array 200 can include a gate electrode 230 between a top dielectric layer 240 and a bottom dielectric layer 220 surround the RPU 260. Thus, the gate electrode 230 contacts a gate dielectric 264 of the RPU 260 in a middle region between the top electrode 250 and the bottom electrode 210. However, where the top electrode 250 and the bottom electrode 210 are arranged in a row and column fashion to only intersect at a particular RPU 260, the gate electrode 230 can contact each RPU 260 to provide a global gate bias to the switching medium 262 of each RPU 260. However, it is also contemplated that the RPUs 260 contact corresponding gate electrodes 230 on an individual or grouped basis. Thus, the gate electrode 230 can form one or more shared gate terminals to control the lateral electric field in the switching medium 262 during global SET and RESET cycles. Thus, non-linear switching behavior can be alleviated in each of the RPUs 260.

Figure 17:
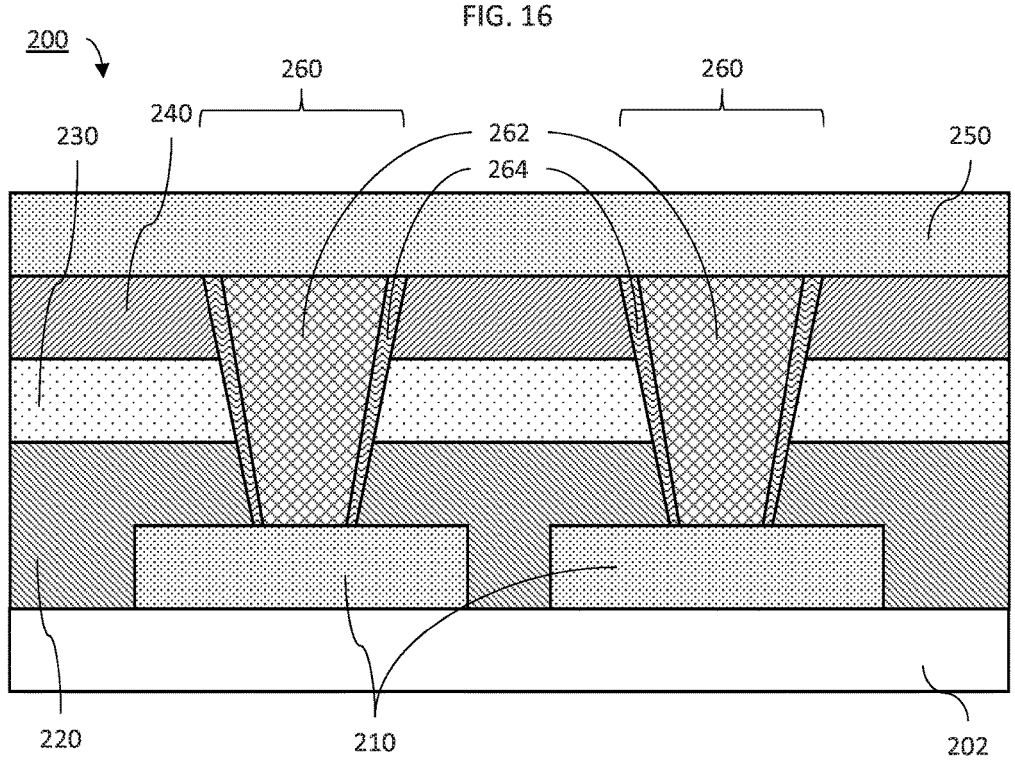
FIG. 17 is a cross-sectional view a cross-sectional view of cross-section 17-17 of the crossbar RPU array of FIG. 15, in accordance with an embodiment of the present invention.

Referring now to FIG. 17, the crossbar RPU array of FIG. 15 is depicted according to an embodiment of the present invention.

As described above, the top electrodes 250 are configured as bars extending across the crossbar device array 200 in a direction perpendicular to the bottom electrodes 210. Accordingly, where cross-section 16-16 depicts the bottom electrodes 210 extending across the device 200 with top electrodes extending depth-wise into the cross-section 16-16, cross-section 17-17 depicts the opposite. Thus, each RPU 260 is located at an intersection of a top electrode 250 and a bottom electrode 210 in the device array 200. Thus, each RPU 260 can be utilized and adjusted with specificity. However, the gate electrode 230 extends uniformly across each cross-section to contact each RPU 260. Thus, the gate electrode 230 can provide a global electrical bias for gate control.

Figure 18:
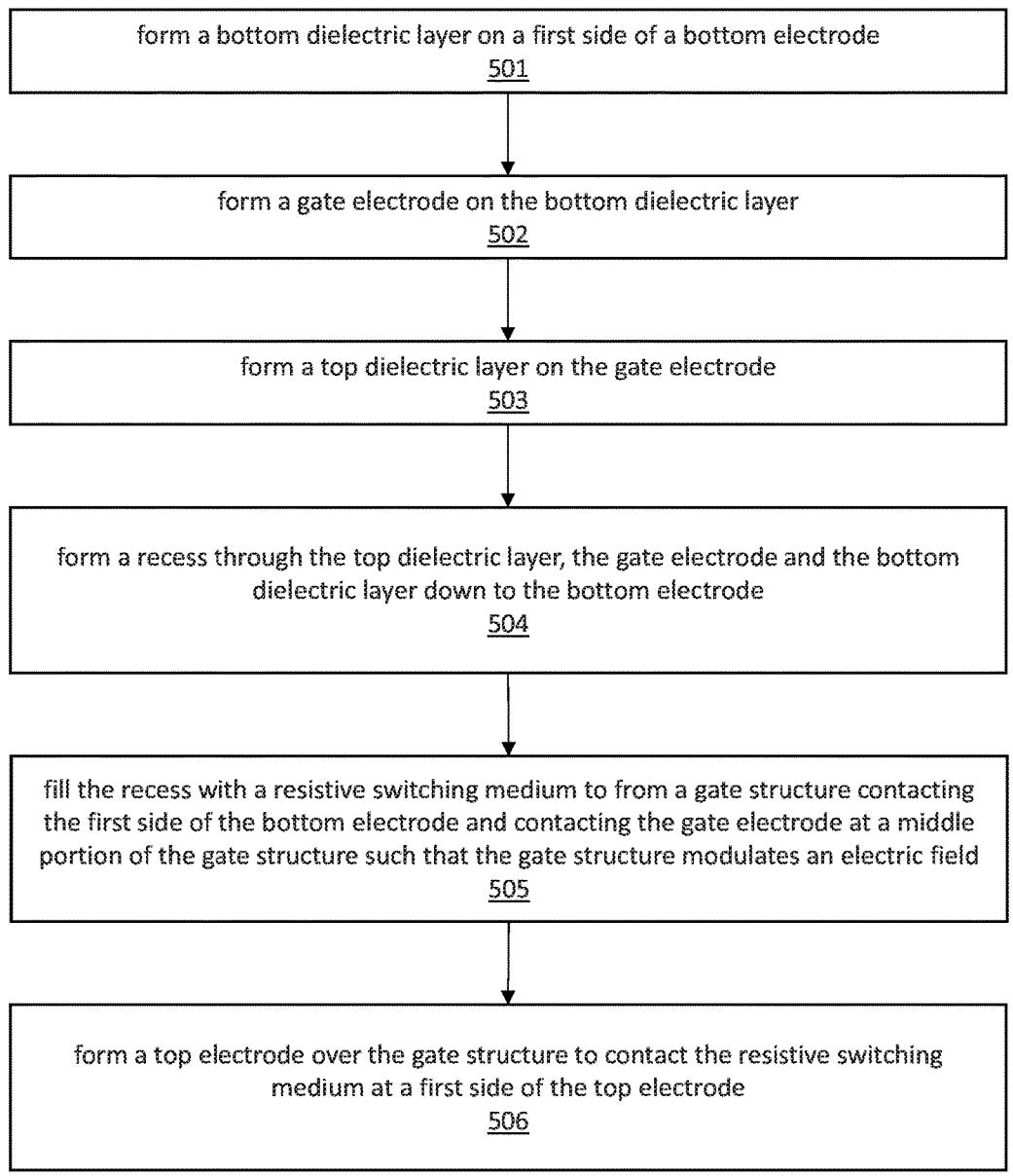
FIG. 18 is a block/flow diagram showing a system/method for forming a RPU with electric gate control, in accordance with an embodiment of the present invention.

Referring now to FIG. 18, a block/flow diagram showing a system/method for forming a RPU with electric gate control is depicted according to an embodiment of the present invention.

At block 501, form a bottom dielectric layer on a first side of a bottom electrode.

At block 502, form a gate electrode on the bottom dielectric layer.

At block 503, form a top dielectric layer on the gate electrode.

At block 504, form a recess through the top dielectric layer, the gate electrode and the bottom dielectric layer down to the bottom electrode.

At block 505, fill the recess with a resistive switching medium to from a gate structure contacting the first side of the bottom electrode and contacting the gate electrode at a middle portion of the gate structure such that the gate structure modulates an electric field.

At block 506, form a top electrode over the gate structure to contact the resistive switching medium at a first side of the top electrode.

Having described preferred embodiments of a system and method for a resistive memory device with electrical gate control (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
a gate structure disposed between a top electrode and a bottom electrode, the gate structure including a resistive switching medium contacting a first side of the top electrode and a first side of the bottom electrode;
a bottom dielectric layer disposed on the first side of the bottom electrode around the gate structure;
a top dielectric layer disposed on the first side of the top electrode around the gate structure; and
a gate electrode disposed between the first dielectric layer and the second dielectric layer and contacting the gate structure in a middle portion thereof to modulate an electric field perpendicular to current flow between the top electrode and the bottom electrode to produce a conductive filament in the resistive switching medium with linear switching relative to the current flow.

2. The semiconductor device as recited in claim 1, wherein the gate structure further includes a gate dielectric around the resistive switching medium between the switching medium and each of the bottom dielectric layer, the top dielectric layer and gate electrode.

3. The semiconductor device as recited in claim 1, wherein the top electrode includes an oxygen scavenging conductive material.

4. The semiconductor device as recited in claim 1, wherein the top electrode is a conductive bar extending in a first direction and the bottom electrode is a conductive bar extending in a second direction perpendicular to the first direction.

5. The semiconductor device as recited in claim 1, wherein the bottom electrode includes a diffusion barrier.

6. The semiconductor device as recited in claim 1, wherein the resistive switching medium include hafnium oxide ($HfO_2$).

7. The semiconductor device as recited in claim 1, wherein the resistive switching medium includes the conductive filament including oxygen vacancies formed by a voltage differential between the top electrode and the bottom electrode such that growth of the conductive filament is modulated by the electric field.

8. The semiconductor device as recited in claim 7, wherein the electric field is disposed in a direction opposite to the growth of the conductive filament.

9. A crossbar array of semiconductor devices, the crossbar array comprising:
a plurality of top electrodes, each top electrode having a bar shape extending in a first direction parallel to each other top electrode;
a plurality of bottom electrodes, each bottom electrode having a bar shape extending in a second direction perpendicular to the first direction and parallel to each other bottom electrode, wherein each of the top electrodes intersects with each of the bottom electrodes at a plurality of intersections to form an array;
a gate structure disposed at each intersection between a corresponding top electrode and a corresponding bottom electrode, the gate structure including a resistive switching medium contacting a first side of the top electrode and a first side of the bottom electrode;
a bottom dielectric layer disposed on the first side of the bottom electrode around the gate structure;
a top dielectric layer disposed on the first side of the top electrode around the gate structure; and
a gate electrode disposed between the first dielectric layer and the second dielectric layer and contacting the gate structure in a middle portion thereof to modulate an electric field perpendicular to current flow between the top electrode and the bottom electrode to produce a conductive filament in the resistive switching medium with linear switching relative to the current flow.

10. The semiconductor device as recited in claim 9, wherein the gate structure further includes a gate dielectric around the resistive switching medium between the switching medium and each of the bottom dielectric layer, the top dielectric layer and gate electrode.

11. The semiconductor device as recited in claim 9, wherein each of the top electrodes includes an oxygen scavenging conductive material.

12. The semiconductor device as recited in claim 9, wherein the gate electrode contacts each of the gate structures in the crossbar array such that the gate electrode provides a global gate bias to each resistive switching medium.

13. The semiconductor device as recited in claim 9, wherein each of the bottom electrodes includes a diffusion barrier.

14. The semiconductor device as recited in claim 9, wherein each resistive switching medium includes hafnium oxide ($HfO_2$).

15. The semiconductor device as recited in claim 9, wherein each resistive switching medium includes the conductive filament including oxygen vacancies formed by a voltage differential between the top electrode and the bottom electrode such that growth of the conductive filament is modulated by the electric field.

16. The semiconductor device as recited in claim 15, wherein the electric field is disposed in a direction opposite to the growth of the conductive filament.

17. A method for forming a semiconductor device, the method comprising: forming a bottom dielectric layer on a first side of a bottom electrode; forming a gate electrode on the bottom dielectric layer; forming a top dielectric layer on the gate electrode; forming a recess through the top dielectric layer, the gate electrode and the bottom dielectric layer down to the bottom electrode; filling the recess with a resistive switching medium to from a gate structure contacting the first side of the bottom electrode and contacting the gate electrode at a middle portion of the gate structure such that the gate structure modulates an electric field; and forming a top electrode over the gate structure to contact the resistive switching medium at a first side of the top electrode; and producing a conductive filament in the resistive switching medium with linear switching using a current flow between the top electrode and the bottom electrode and modulating the electric field with the gate electrode.

18. The method as recited in claim 17, wherein the resistive switching medium include hafnium oxide ($HfO_2$).

19. The method as recited in claim 17, wherein the resistive switching medium includes a conductive filament including oxygen vacancies formed by a voltage differential between the top electrode and the bottom electrode such that growth of the conductive filament is modulated by the electric field.

20. The method as recited in claim 19, wherein the electric field is disposed in a direction opposite to the growth of the conductive filament.

* * * * *